US012782393B2

(12) United States Patent
Yu et al.

(10) Patent No.: US 12,782,393 B2
(45) Date of Patent: Nov. 3, 2026

(54) METHOD OF TESTING SEMICONDUCTOR DEVICE

(71) Applicant: NANYA TECHNOLOGY CORPORATION, New Taipei City (TW)

(72) Inventors: Ting-Wei Yu, New Taipei City (TW); Kuan-Tsung Lin, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 137 days.

(21) Appl. No.: 18/890,785

(22) Filed: Sep. 20, 2024

(65) Prior Publication Data

US 2026/0086120 A1 Mar. 26, 2026

(51) Int. Cl.
*G01R 1/073* (2006.01)
*G01R 31/28* (2006.01)

(52) U.S. Cl.
CPC ..... *G01R 1/07342* (2013.01); *G01R 31/2887* (2013.01)

(58) Field of Classification Search
CPC ........................ G01R 1/07342; G01R 31/2887
See application file for complete search history.

(56) References Cited

U.S. PATENT DOCUMENTS

| | | | | |
|---|---|---|---|---|
| 2017/0322236 A1* | 11/2017 | Ozawa | ............... | G01R 1/07378 |
| 2018/0156842 A1* | 6/2018 | Kim | .................... | G01R 1/07342 |
| 2020/0141976 A1* | 5/2020 | Lim | .................... | G01R 1/06794 |

FOREIGN PATENT DOCUMENTS

TW I803103 B * 5/2023

OTHER PUBLICATIONS

Translation of TWI 110147189 A (Year: 2023).*

* cited by examiner

*Primary Examiner* — Paresh Patel
(74) *Attorney, Agent, or Firm* — CKC & Partners Co., LLC

(57) ABSTRACT

The present disclosure provides a method of testing a semiconductor device. The method includes: providing a wafer on a chuck; moving the chuck to a first expected position under a probe card; moving the chuck from the first expected position to a second expected position so that a plurality of dies of the wafer contact a plurality of pins of the probe card; testing a first portion of the dies of the wafer; moving the chuck to the second expected position so that the dies of the wafer abut against the pins of the probe card; and testing a second portion of the dies of the wafer.

18 Claims, 9 Drawing Sheets

METHOD OF TESTING SEMICONDUCTOR DEVICE

BACKGROUND

Field of Invention

The present invention relates to a method of testing a semiconductor device.

Description of Related Art

As the probe card is allowed to perform a single testing by only single touchdown, 1536 DUTs awaits for the single testing. Poor yield may occur due to excessive temperature or insufficient voltage during the testing, so the number of the DUTs tested in the single testing could be reduced by disassembling the whole testing into several touchdowns and the DUTs could be tested repeatedly in fixed coordinates without leaving the pins of the probe card. However, when performing a subsequent probe mark inspection (PMI), the pins will be inspected and returned to the original coordinates for another touchdown, resulting in excessive probe marks on the DUTs, thereby causing the meets of the customer unsatisfied.

SUMMARY

In view of this, one purpose of the present disclosure is to provide a method of testing a semiconductor device that can solve the aforementioned problems.

In order to achieve the above objective, according to an embodiment of the present disclosure, a method of testing a semiconductor device includes: providing a wafer on a chuck; moving the chuck to a first expected position under a probe card; moving the chuck from the first expected position to a second expected position so that a plurality of dies of the wafer contact a plurality of pins of the probe card; testing a first portion of the dies of the wafer; moving the chuck to the second expected position so that the dies of the wafer abut against the pins of the probe card; and testing a second portion of the dies of the wafer.

In one or more embodiments of the present disclosure, moving the chuck to the first expected position under the probe card so that the dies of the wafer do not contact the pins of the probe card.

In one or more embodiments of the present disclosure, the wafer contacts the pins of the probe card as the chuck is in the second expected position.

In one or more embodiments of the present disclosure, moving the chuck from the first expected position to the second expected position is substantially moving the chuck upwardly.

In one or more embodiments of the present disclosure, testing the second portion of the dies of the wafer is performed after testing the first portion of the dies of the wafer.

In one or more embodiments of the present disclosure, testing the first portion of the dies of the wafer and testing the second portion of the dies of the wafer are performed as the chuck is in the second expected position.

In one or more embodiments of the present disclosure, moving the chuck to the second expected position so that the dies of the wafer abut against the pins of the probe card is performed after testing the first portion of the dies of the wafer.

In one or more embodiments of the present disclosure, moving the chuck to the second expected position so that the dies of the wafer abut against the pins of the probe card is substantially retaining the chuck in the second expected position.

In one or more embodiments of the present disclosure, testing the second portion of the dies of the wafer is performed after moving the chuck to the second expected position so that the dies of the wafer abut against the pins of the probe card.

In one or more embodiments of the present disclosure, the method further includes moving the chuck from the second expected position to the first expected position performed after testing the second portion of the dies of the wafer.

In order to achieve the above objective, according to an embodiment of the present disclosure, a method of testing a semiconductor device includes: moving a chuck to a first expected position under a probe card, wherein a wafer is disposed on the chuck; moving the chuck from the first expected position to a second expected position so that a plurality of dies of the wafer contact a plurality of pins of the probe card; testing a first portion of the dies of the wafer; moving the chuck to the second expected position so that the dies of the wafer abut against the pins of the probe card; and testing a second portion of the dies of the wafer, wherein the second portion of the dies of the wafer is different from the first portion of the dies of the wafer.

In one or more embodiments of the present disclosure, moving the chuck to the first expected position under the probe card so that the dies of the wafer do not contact the pins of the probe card.

In one or more embodiments of the present disclosure, the wafer contacts the pins of the probe card as the chuck is in the second expected position.

In one or more embodiments of the present disclosure, moving the chuck from the first expected position to the second expected position is substantially moving the chuck upwardly.

In one or more embodiments of the present disclosure, testing the second portion of the dies of the wafer is performed after testing the first portion of the dies of the wafer.

In one or more embodiments of the present disclosure, testing the first portion of the dies of the wafer and testing the second portion of the dies of the wafer are performed as the chuck is in the second expected position.

In one or more embodiments of the present disclosure, moving the chuck to the second expected position so that the dies of the wafer abut against the pins of the probe card is performed after testing the first portion of the dies of the wafer.

In one or more embodiments of the present disclosure, moving the chuck to the second expected position so that the dies of the wafer abut against the pins of the probe card is substantially retaining the chuck in the second expected position.

In one or more embodiments of the present disclosure, testing the second portion of the dies of the wafer is performed after moving the chuck to the second expected position so that the dies of the wafer abut against the pins of the probe card.

In one or more embodiments of the present disclosure, the method further includes moving the chuck from the second expected position to the first expected position performed after testing the second portion of the dies of the wafer.

In summary, in the method of testing the semiconductor of the present disclosure, since the step of moving the chuck to the second expected position so that the dies of the wafer abut against the pins of the probe card is substantially retaining the chuck in the second expected position, and since the step of testing the first portion of the dies of the wafer and the step of testing the second portion of the dies of the wafer are performed as the chuck is in the second expected position, the probe card can perform the testing without leaving the dies of the wafer, thereby achieving the effect of reducing the probe marks appearing on the dies of the wafer. In the method of testing the semiconductor of the present disclosure, since the step of testing the first portion of the dies of the wafer and the step of testing the second portion of the dies of the wafer are performed individually, the probe card can perform the plurality of tests in the same coordinates without moving the chuck, thereby achieving the effect of avoiding the problems of excessive temperature or insufficient voltage during the testing. Overall, the method of testing the semiconductor device of the present disclosure not only improves the yield of the dies of the wafer and prevents the problem of excessive probe marks.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
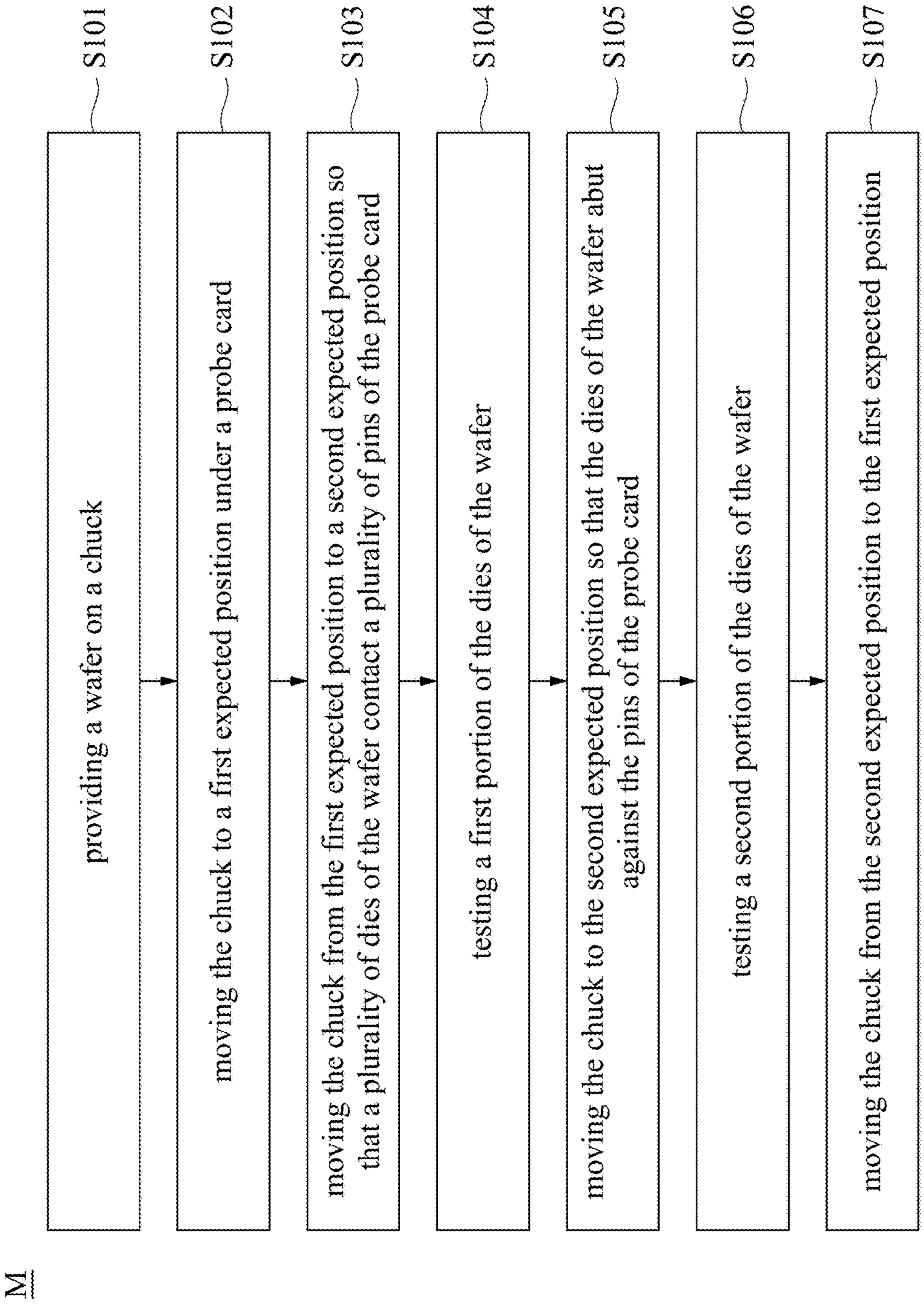
FIG. 1 is a flow chart of a method of testing a semiconductor device in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The system may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Reference is made to FIG. 1. FIG. 1 is a flow chart of a method M of testing a semiconductor device in accordance with an embodiment of the present disclosure. The method M shown in FIG. 1 includes a step S101, a step S102, a step S103, a step S104, a step S105, a step S106, and a step S107. Please refer to FIG. 1, FIG. 2, and FIG. 3 for better understanding the step S101. Please refer to FIG. 1 and FIG. 4 for better understanding the step S102. Please refer to FIG. 1 and FIG. 5 for better understanding the step S103. Please refer to FIG. 1 and FIG. 6 for better understanding the step S104. Please refer to FIG. 1 and FIG. 7 for better understanding the step S105. Please refer to FIG. 1 and FIG. 8 for better understanding the step S106. Please refer to FIG. 1 and FIG. 9 for better understanding the step S107.

Step S101, step S102, step S103, step S104, step S105, step S106, and step S107 are described in detail below.

Step S101: Providing a Wafer WF on a Chuck 120.

Figure 2:
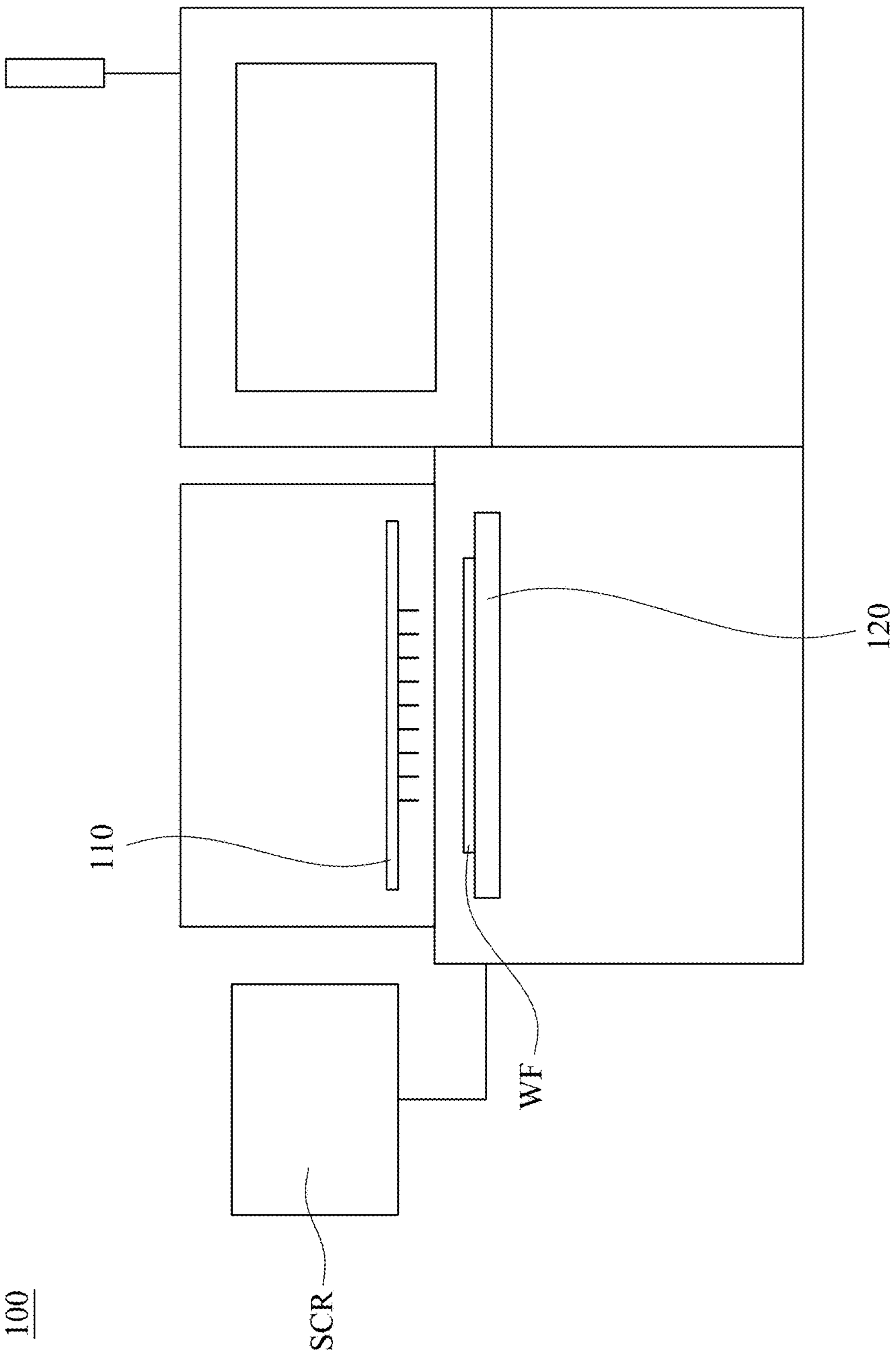
FIG. 2 is a schematic view of a prober in accordance with an embodiment of the present disclosure.
Figure 3:
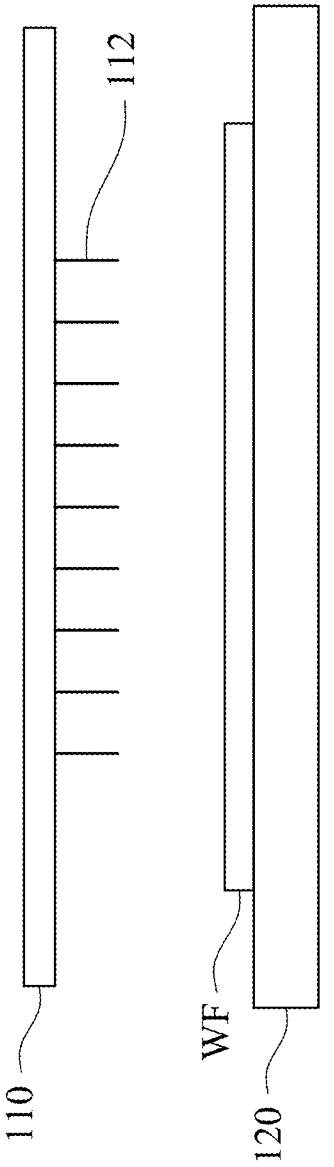
FIG. 3 is a schematic view of an intermediate stage of testing the semiconductor device in accordance with an embodiment of the present disclosure.

Reference is made to FIG. 2 and FIG. 3. FIG. 2 is a schematic view of a prober 100 in accordance with an embodiment of the present disclosure. FIG. 3 is a schematic view of an intermediate stage of testing the semiconductor device in accordance with an embodiment of the present disclosure. As shown in FIG. 2, in this embodiment, a prober 100 is provided. The prober 100 includes a probe card 110, a chuck 120, and a display device SCR. The probe card 110 is disposed over the chuck 120. The probe card 110 is configured to perform one or more tests of a wafer WF, as shown in FIG. 2. The wafer WF is provided on the chuck 120. More specifically, the chuck 120 is configured to support the wafer WF. In some embodiments, the wafer WF may be provided on the chuck 120 by a robot, a mechanical arm, or other suitable lifting device. The display device SCR is configured to display images of the probe card 110, the chuck 120, and the wafer WF. In this embodiment, the prober 100 further includes a processing unit (not shown). The processing unit is configured to move the chuck 120 inside the prober 100. The processing unit is further configured to test the wafer WF via the probe card 110.

Reference is made again to FIG. 3. As shown in FIG. 3, the probe card 110 includes a plurality of pins 112. The pins 112 are configured to transfer the test signals from the processing unit of the prober 100. The pins 112 are corresponded to dies (not shown in FIG. 3) of the wafer WF. For simplicity, there are nine pins 112 depicted in FIG. 3. However, the present disclosure is not intended to limit the quantity of the pins 112 of the probe card 110.

Step S102: Moving the chuck 120 to a first expected position P1 under the probe card 110.

Figure 4:
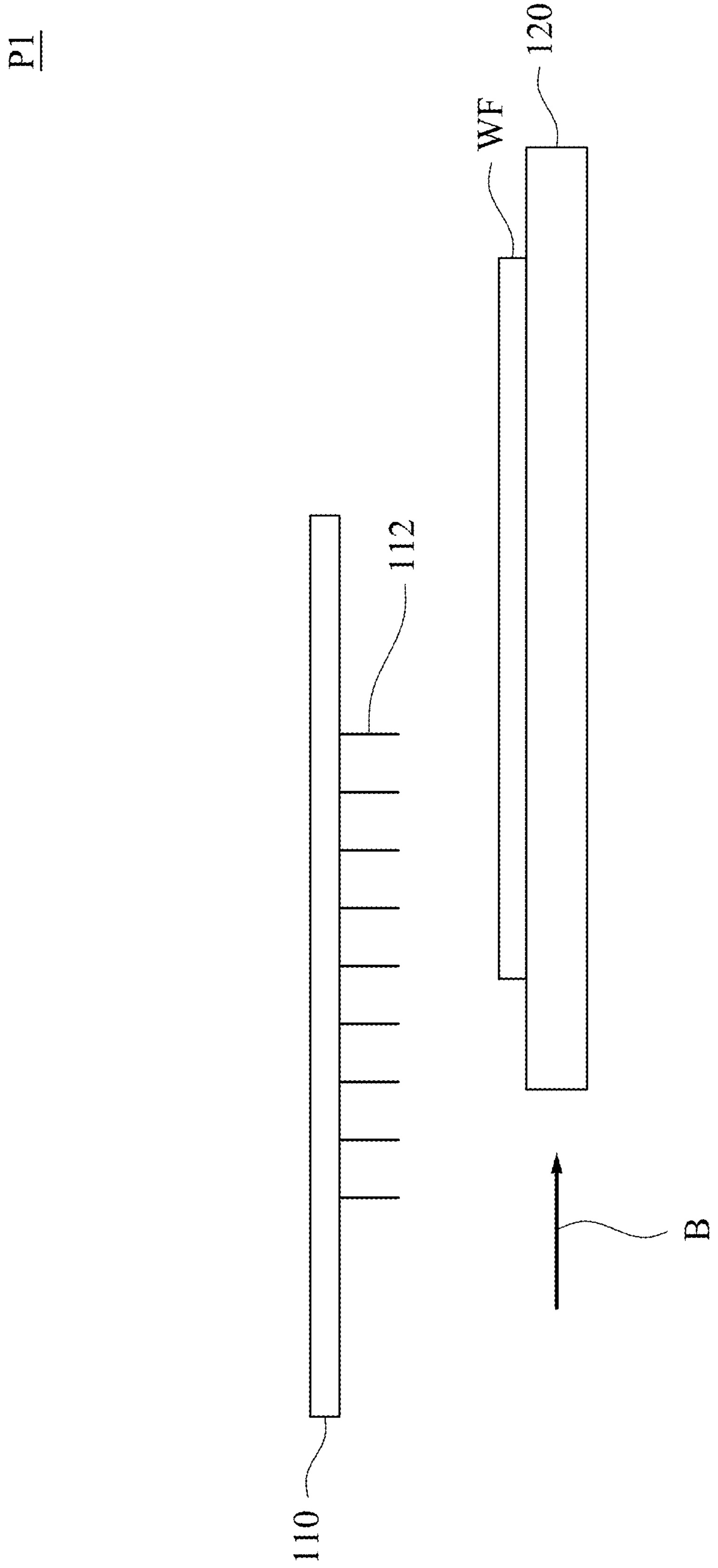
FIG. 4 is a schematic view of an intermediate stage of testing the semiconductor device in accordance with an embodiment of the present disclosure.

Reference is made again to FIG. 4. FIG. 4 is a schematic view of an intermediate stage of testing the semiconductor device in accordance with an embodiment of the present disclosure. As shown in FIG. 4, in this embodiment, the chuck 120 is moved to the first expected position P1 under the probe card 110 by an operation B. Specifically, the operation B is performed such that the chuck 120 placed with wafer WF is moved to the first expected position P1, which is under the probe card 110. In some embodiments, the chuck 120 is laterally moved to the first expected position P1. As shown in FIG. 4, the chuck 120 is moved relative to the probe card 110. In other words, the probe card 110 is relatively stationary. As the chuck 120 is in the first expected position P1, the dies of the wafer WF do not contact the pins 112 of the probe card 110.

In some embodiments, the step of providing the wafer WF on the chuck 120 (i.e., step S101) is performed before the step of moving the chuck 120 to the first expected position P1 under the probe card 110 (i.e., step S102).

In a usage scenario, the processing unit of the prober 100 performs the operation B to move the chuck 120 to the first expected position P1. More specifically, the processing unit laterally moves the chuck 120 to the first expected position P1 so that the dies of the wafer WF do not contact the pins 112 of the probe card 110.

Step S103: Moving the chuck 120 from the first expected position P1 to a second expected position P2.

Figure 5:
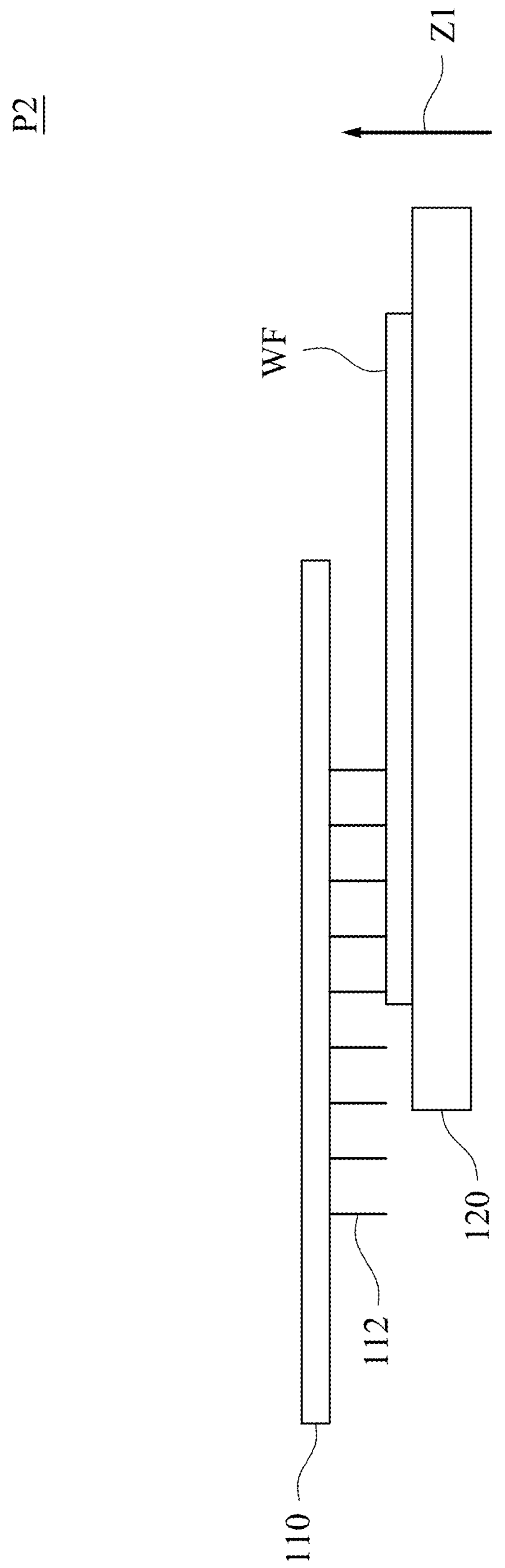
FIG. 5 is a schematic view of an intermediate stage of testing the semiconductor device in accordance with an embodiment of the present disclosure.

Reference is made again to FIG. 5. FIG. 5 is a schematic view of an intermediate stage of testing the semiconductor device in accordance with an embodiment of present disclosure. As shown in FIG. 5, in this embodiment, the chuck 120 is moved from the first expected position P1 to the second expected position P2 by an operation Z1. Specifically, the operation Z1 is performed such that the chuck 120 placed with wafer WF is moved from the first expected position P1 to the second expected position P2, so that the dies of the wafer WF contact the pins 112 of the probe card 110. In some embodiments, the chuck 120 is moved upwardly to the second expected position P2. As shown in FIG. 5, the chuck 120 is moved relative to the probe card 110. In other words, the probe card 110 is relatively stationary. As the chuck 120 is in the second expected position P2, the dies of the wafer WF contact the pins 112 of the probe card 110. In some embodiments, the operation Z1 is performed such that the dies of the wafer WF abut against the pins 112 of the probe card 110. If the processing unit senses the dies of the wafer WF abut against the pins 112 of the probe card 110, the processing unit then terminates the operation Z1 to hold the chuck 120 placed with the wafer WF in the second position P2.

In some embodiments, the step of moving the chuck 120 from the first expected position P1 to the second expected position P2 (i.e., step S103) is performed after the step of moving the chuck 120 to the first expected position P1 under the probe card 110 (i.e., step S102).

In a usage scenario, the processing unit of the prober 100 performs the operation Z1 to move the chuck 120 from the first expected position P1 to the second expected position P2. More specifically, the processing unit moves the chuck 120 upwardly to the second expected position P2 so that the dies of the wafer WF contact the pins 112 of the probe card 110.

Step S104: Testing a First Portion of the Dies of the Wafer WF.

Figure 6:
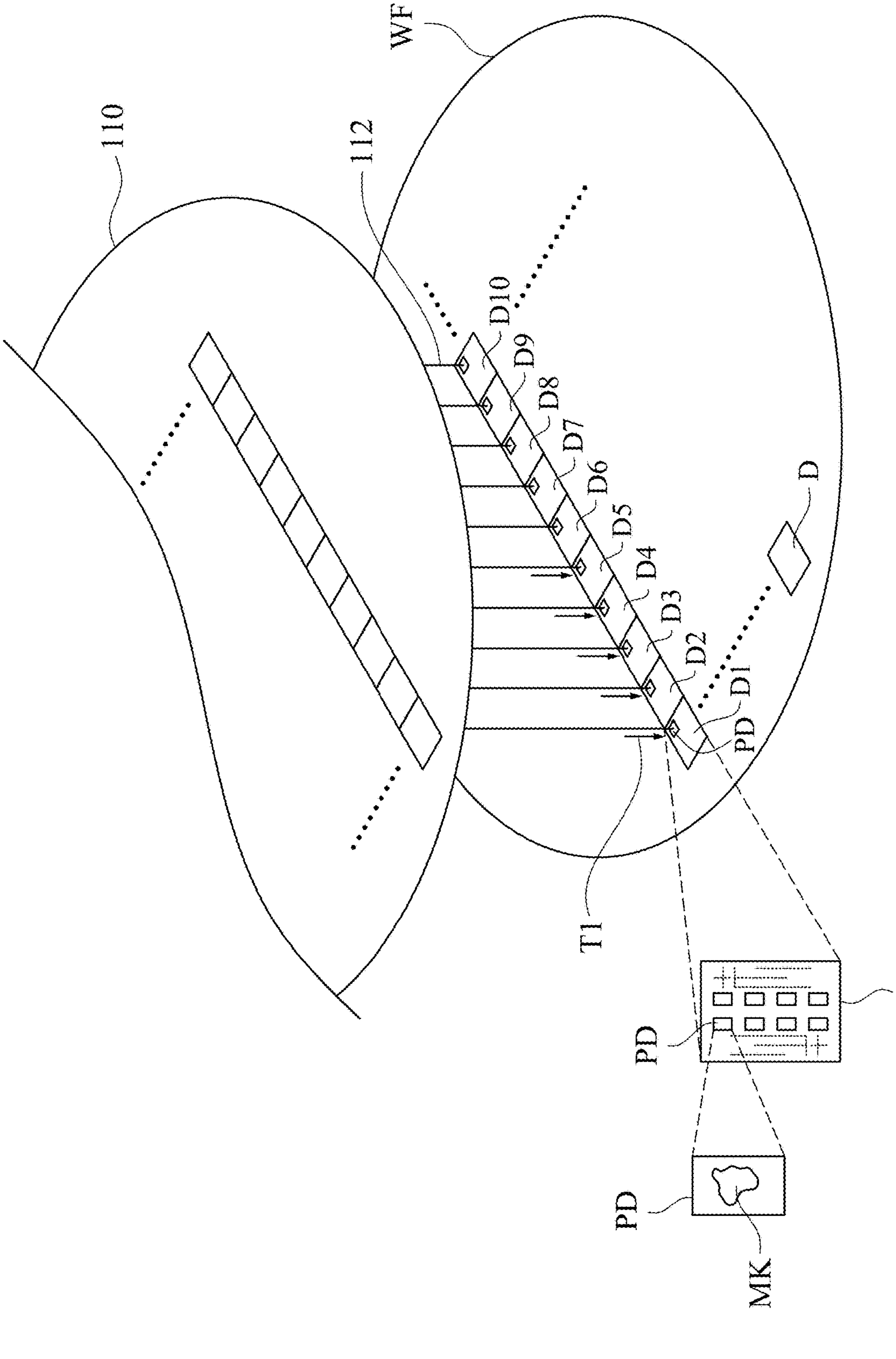
FIG. 6 is a schematic view of an intermediate stage of testing the semiconductor device in accordance with an embodiment of the present disclosure.

Reference is made again to FIG. 6. FIG. 6 is a schematic view of an intermediate stage of testing the semiconductor device in accordance with an embodiment of present disclosure. As shown in FIG. 6, in this embodiment, a plurality of dies D of the wafer WF are tested by an operation T1. Specifically, the operation T1 is performed such that the first portion of the dies D is tested by the pins 112 of the probe card 110. As shown in FIG. 6, for instance, the dies D include a die D1, a die D2, a die D3, a die D4, a die D5, a die D6, a die D7, a die D8, a die D9, and a die D10. The die D1, the die D2, the die D3, the die D4, and the die D5 are the first portion of the dies D of the wafer WF, whereas the die D6, the die D7, the die D8, the die D9, and the die D10 are a second portion of the dies D of the wafer WF. In other words, the second portion of the dies D of the wafer WF is different from the first portion of the dies D of the wafer W. Each of the dies D includes a plurality of tested pads PD. As shown in FIG. 6, the pins 112 of the probe card 110 contact the tested pads PD of the dies D of the wafer WF, and only the first portion of the dies D of the wafer WF (e.g., the die D1, the die D2, the die D3, the die D4, and the die D5) is tested. In other words, the second portion of the dies D of the wafer WF (e.g., the die D6, the die D7, the die D8, the die D9, and the die D10) is not tested in the operation T1.

In some embodiments, the step of testing a first portion of the dies of the wafer W (i.e., step S104) is performed after the step of moving the chuck 120 from the first expected position P1 to a second expected position P2 (i.e., step S103).

In a usage scenario, the processing unit of the prober 100 performs the operation T1 to test the first portion of the dies D of the wafer WF. More specifically, the pins 112 of the probe card 110 contact the tested pads PD of the dies D of the wafer WF, but the processing unit only sends the test signals to the first portion of the dies D of the wafer WF via the pins 112 of the probe card 110. As shown in FIG. 6, in some embodiments, probe marks MK will be generated on the tested pads PD of the first portion of the dies D of the wafer WF after the operation T1 is performed.

Step S105: moving the chuck 120 to the second expected position P2.

Figure 7:
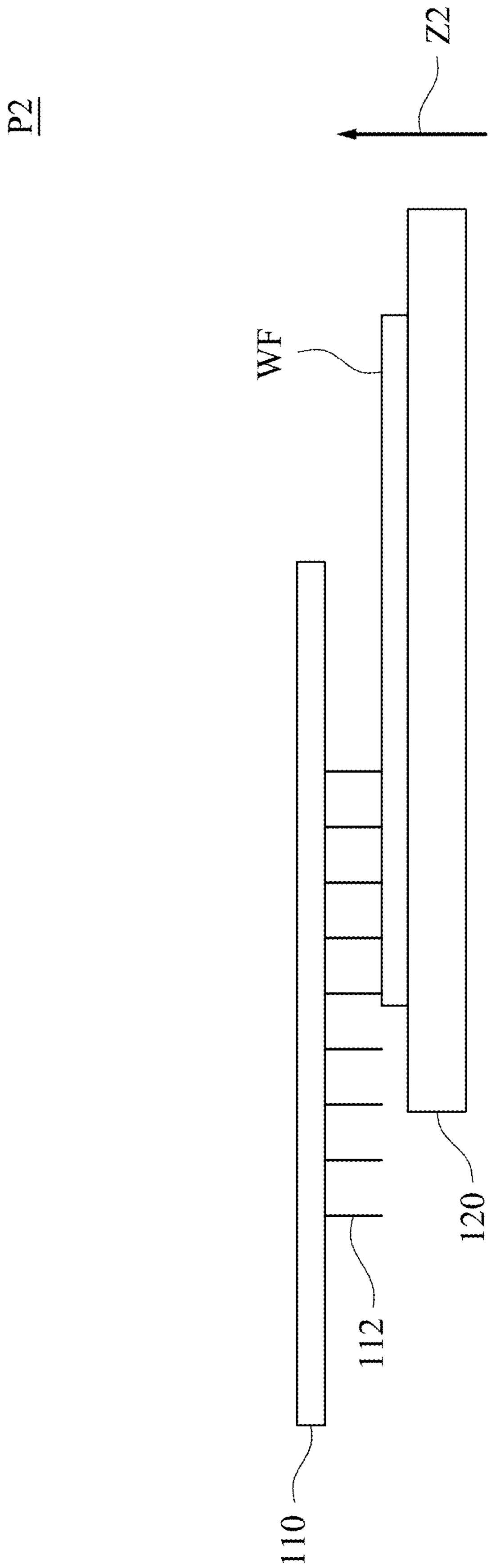
FIG. 7 is a schematic view of an intermediate stage of testing the semiconductor device in accordance with an embodiment of the present disclosure.

Reference is made again to FIG. 7. FIG. 7 is a schematic view of an intermediate stage of testing the semiconductor device in accordance with an embodiment of the present disclosure. As shown in FIG. 7, in this embodiment, the chuck 120 is moved to the second expected position P2 by an operation Z2. Specifically, the operation Z2 is performed such that the chuck 120 placed with wafer WF is moved to the second expected position P2, so that the dies D of the wafer WF abut against the pins 112 of the probe card 110. In some embodiments, the chuck 120 is substantially moved upwardly to the second expected position P2 during the operation Z2. As shown in FIG. 7, the chuck 120 is moved relative to the probe card 110. In other words, the probe card 110 is relatively stationary. As the chuck 120 is in the second expected position P2, the dies of the wafer WF contact the pins 112 of the probe card 110. In some embodiments, the operation Z2 (i.e., step S105) is substantially retaining the chuck 120 in the second expected position P2. More specifically, since the chuck 120 placed with the wafer WF is retained in the second expected position P2 after the operation T1 is performed, the chuck 120 may actually stay in the second position P2 even though the processing unit attempts to move the chuck 120 during the operation Z2. If the processing unit senses the dies of the wafer WF abut against the pins 112 of the probe card 110, the processing unit then terminates the operation Z2 to hold the chuck 120 placed with the wafer WF in the second position P2.

In some embodiments, the step of moving the chuck 120 to the second expected position P2 so that the dies D of the wafer WF abut against the pins 112 of the probe card 110 (i.e., step S105) is performed after the step of testing the first portion of the dies D of the wafer WF (i.e., step S104).

In a usage scenario, the processing unit of the prober 100 performs the operation Z2 to move the chuck 120 to the second expected position P2. More specifically, the processing unit moves the chuck 120 upwardly to the second expected position P2 until the dies D of the wafer WF contact the pins 112 of the probe card 110. However, the chuck 120 has been already moved to the second expected position P2 during the previous operation in some embodiments, so the chuck 120 is substantially retained in the second expected position P2 during the operation Z2.

Step S106: Testing the Second Portion of the Dies D of the Wafer WF.

Figure 8:
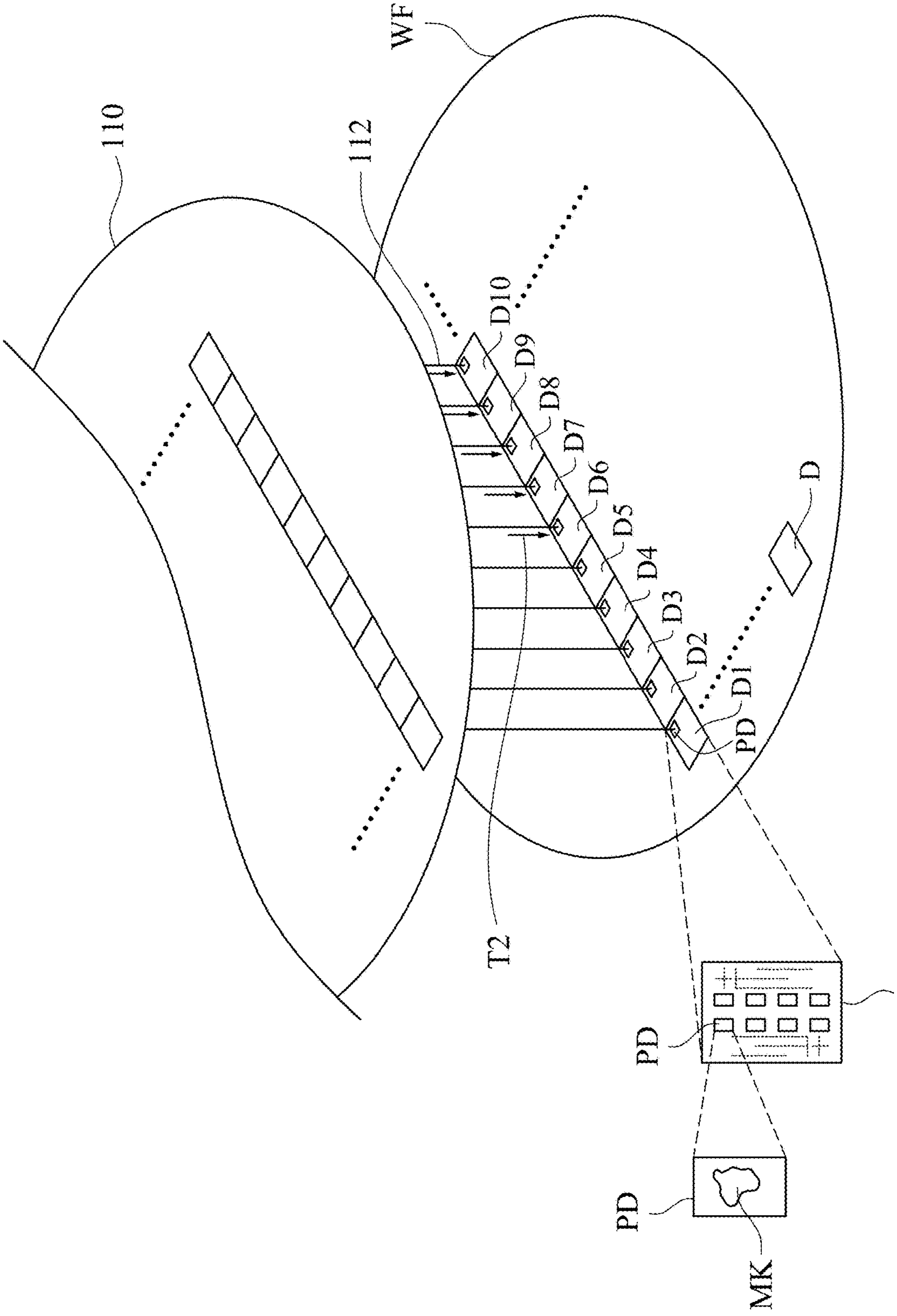
FIG. 8 is a schematic view of an intermediate stage of testing the semiconductor device in accordance with an embodiment of the present disclosure.

Reference is made again to FIG. 8. FIG. 8 is a schematic view of an intermediate stage of testing the semiconductor device in accordance with an embodiment of the present disclosure. As shown in FIG. 8, in this embodiment, the dies D of the wafer WF are tested by an operation T2. Specifically, the operation T2 is performed such that the second portion of the dies D is tested by the pins 112 of the probe card 110. As shown in FIG. 8, for instance, the die D6, the die D7, the die D8, the die D9, and the die D10 are the second portion of the dies D of the wafer WF. In other words, the second portion of the dies D of the wafer WF is different from the first portion of the dies D of the wafer W. As shown in FIG. 8, the pins 112 of the probe card 110 contact the tested pads PD of the dies D of the wafer WF, and only the second portion of the dies D of the wafer WF (e.g., the die D6, the die D7, the die D8, the die D9, and the die D10) is tested. In other words, the first portion of the dies D of the wafer WF (e.g., the die D1, the die D2, the die D3, the die D4, and the die D5) is not tested in the operation T2 since the first portion of the dies D of the wafer WF has been already tested during the operation T1.

In some embodiments, the step of testing the second portion of the dies D of the wafer WF (i.e., step S106) is performed after the step of moving the chuck 120 to the second expected position P2 so that the dies D of the wafer WF abut against the pins 112 of the probe card 110 (i.e., step S105). In some embodiments, the step of testing the second portion of the dies D of the wafer WF (i.e., step S106) is performed the step of after testing the first portion of the dies D of the wafer WF (i.e., step S104). In some embodiments, the step of testing the first portion of the dies of the wafer (i.e., step S104) and testing the second portion of the dies of the wafer (i.e., step S106) are performed as the chuck 120 is in the second expected position P2, as shown in FIG. 6 and FIG. 8. More specifically, the chuck 120 placed with the wafer WF stays in the second expected position P2 without altering the coordinates during both the operation T1 and the operation T2.

In a usage scenario, the processing unit of the prober 100 performs the operation T2 to test the second portion of the dies D of the wafer WF. More specifically, the pins 112 of the probe card 110 contact the tested pads PD of the dies D of the wafer WF, but the processing unit only sends the test signals to the second portion of the dies D of the wafer WF via the pins 112 of the probe card 110. As shown in FIG. 8, in some embodiments, probe marks MK will be generated on the tested pads PD of the second portion of the dies D of the wafer WF after the operation T2 is performed.

Step S107: Moving the chuck 120 from the second expected position P2 to the first expected position P1.

Figure 9:
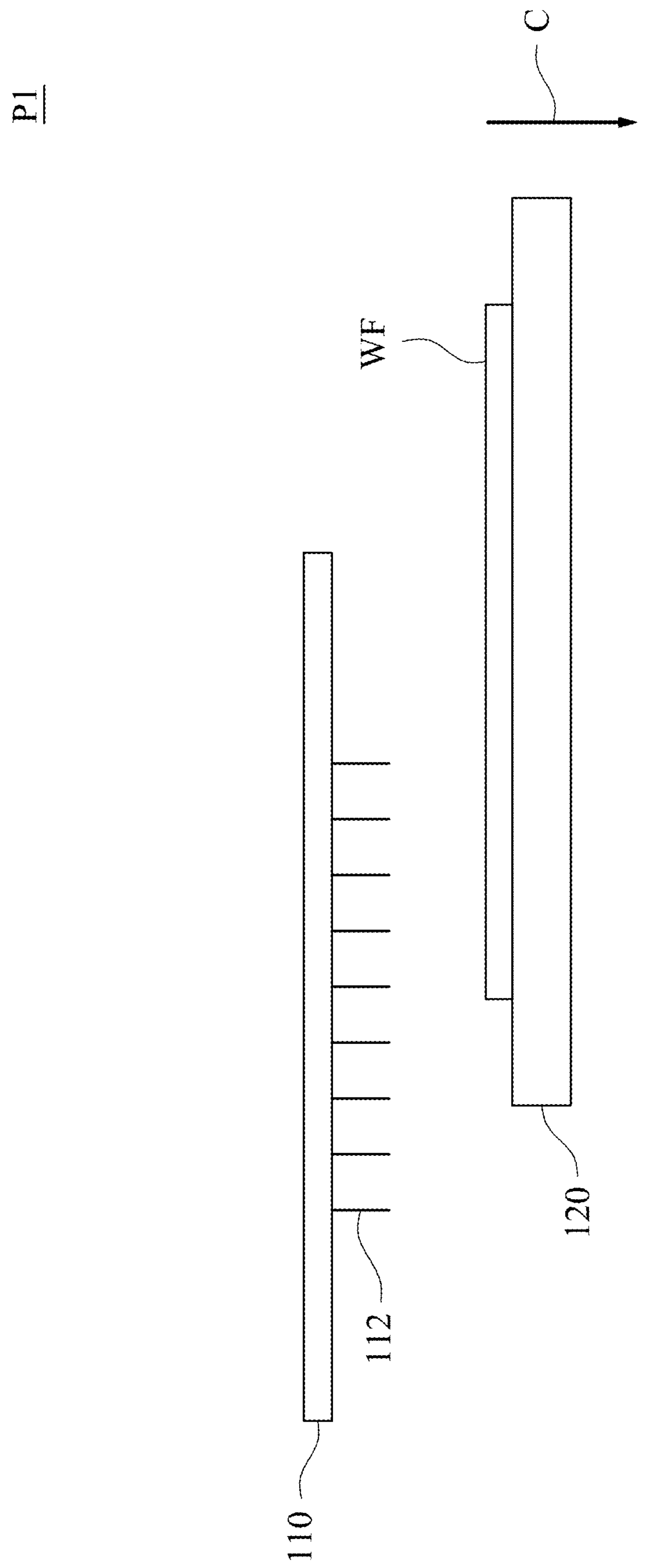
FIG. 9 a schematic view of an intermediate stage of testing the semiconductor device in accordance with an embodiment of the present disclosure.

Reference is made again to FIG. 9. FIG. 9 is a schematic view of an intermediate stage of testing the semiconductor device in accordance with an embodiment of the present disclosure. As shown in FIG. 9, in this embodiment, the chuck 120 is moved from the second expected position P2 to the first expected position P1 by an operation C. Specifically, the operation C is performed such that the chuck 120 placed with wafer WF is moved from the second expected position P2 to the first expected position P1, so that the dies D of the wafer WF move away from the pins 112 of the probe card 110. In some embodiments, the chuck 120 is moved downwardly to the first expected position P1. As shown in FIG. 9, the chuck 120 is moved relative to the probe card 110. In other words, the probe card 110 is relatively stationary. As the chuck 120 is in the first expected position P1, the dies D of the wafer WF do not contact the pins 112 of the probe card 110. In other words, the dies D of the wafer WF leave the pins 112 of the probe card 110. In some embodiments, the operation C is performed such that the dies D of the wafer WF do not abut against the pins 112 of the probe card 110. After the operation C is performed, the process unit controls another device to perform a probe mark inspection (PMI) process for the dies D of the wafer WF.

In some embodiments, the step of moving the chuck 120 from the second expected position P2 to the first expected position P1 (i.e., step S107) is performed after the step of testing the second portion of the dies D of the wafer WF (i.e., step S106).

In a usage scenario, the processing unit of the prober 100 performs the operation C to move the chuck 120 from the second expected position P2 to the first expected position P1. More specifically, the processing unit moves the chuck 120 downwardly to the first expected position P1 so that the dies D of the wafer WF move away from the pins 112 of the probe card 110.

By performing the method M shown in FIG. 1 of the present disclosure, the prober 100 can perform a complete test without the pins 112 leaving the dies D of the wafer WF, thereby reducing the probe marks MK generated on the tested pads PD.

Based on the above discussions, it can be seen that in the method of testing the semiconductor of the present disclosure, since the step of moving the chuck to the second expected position so that the dies of the wafer abut against the pins of the probe card is substantially retaining the chuck in the second expected position, and since the step of testing the first portion of the dies of the wafer and the step of testing the second portion of the dies of the wafer are performed as the chuck is in the second expected position, the probe card can perform the testing without leaving the dies of the wafer, thereby achieving the effect of reducing the probe marks appearing on the dies of the wafer. In the method of testing the semiconductor of the present disclosure, since the step of testing the first portion of the dies of the wafer and the step of testing the second portion of the dies of the wafer are performed individually, the probe card can perform the plurality of tests in the same coordinates without moving the chuck, thereby achieving the effect of avoiding the problems of excessive temperature or insufficient voltage during the testing. Overall, the method of testing the semiconductor device of the present disclosure not only improves the yield of the dies of the wafer and prevents the problem of excessive probe marks.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of testing a semiconductor device, comprising:

providing a wafer on a chuck;

moving the chuck to a first expected position under a probe card;

moving the chuck from the first expected position to a second expected position so that a plurality of dies of the wafer contact a plurality of pins of the probe card;

testing a first portion of the dies of the wafer;

performing an operation after moving the chuck from the first expected position to the second expected position, wherein the operation is moving the chuck, when it is determined that the chuck is moved to the second expected position by the operation, the operation is terminated, so that the dies of the wafer abut against the pins of the probe card; and testing a second portion of the dies of the wafer.

2. The method of claim 1, wherein moving the chuck to the first expected position under the probe card so that the dies of the wafer do not contact the pins of the probe card.

3. The method of claim 1, wherein the wafer contacts the pins of the probe card as the chuck is in the second expected position.

4. The method of claim 1, wherein moving the chuck from the first expected position to the second expected position is substantially moving the chuck upwardly.

5. The method of claim 1, wherein testing the second portion of the dies of the wafer is performed after testing the first portion of the dies of the wafer.

6. The method of claim 1, wherein testing the first portion of the dies of the wafer and testing the second portion of the dies of the wafer are performed as the chuck is in the second expected position.

7. The method of claim 1, wherein moving the chuck to the second expected position so that the dies of the wafer abut against the pins of the probe card is performed after testing the first portion of the dies of the wafer.

8. The method of claim 1, wherein testing the second portion of the dies of the wafer is performed after moving the chuck to the second expected position so that the dies of the wafer abut against the pins of the probe card.

9. The method of claim 1, further comprising moving the chuck from the second expected position to the first expected position performed after testing the second portion of the dies of the wafer.

10. A method of testing a semiconductor device, comprising:

moving a chuck to a first expected position under a probe card, wherein a wafer is disposed on the chuck;

moving the chuck from the first expected position to a second expected position so that a plurality of dies of the wafer contact a plurality of pins of the probe card;

testing a first portion of the dies of the wafer;

performing an operation after moving the chuck from the first expected position to the second expected position, wherein the operation is moving the chuck, when it is determined that the chuck is moved to the second expected position by the operation, the operation is terminated, so that the dies of the wafer abut against the pins of the probe card; and testing a second portion of the dies of the wafer, wherein the second portion of the dies of the wafer is different from the first portion of the dies of the wafer.

11. The method of claim 10, wherein moving the chuck to the first expected position under the probe card so that the dies of the wafer do not contact the pins of the probe card.

12. The method of claim 10, wherein the wafer contacts the pins of the probe card as the chuck is in the second expected position.

13. The method of claim 10, wherein moving the chuck from the first expected position to the second expected position is substantially moving the chuck upwardly.

14. The method of claim 10, wherein testing the second portion of the dies of the wafer is performed after testing the first portion of the dies of the wafer.

15. The method of claim 10, wherein testing the first portion of the dies of the wafer and testing the second portion of the dies of the wafer are performed as the chuck is in the second expected position.

16. The method of claim 10, wherein moving the chuck to the second expected position so that the dies of the wafer abut against the pins of the probe card is performed after testing the first portion of the dies of the wafer.

17. The method of claim 10, wherein testing the second portion of the dies of the wafer is performed after moving the chuck to the second expected position so that the dies of the wafer abut against the pins of the probe card.

18. The method of claim 10, further comprising moving the chuck from the second expected position to the first expected position performed after testing the second portion of the dies of the wafer.

* * * * *